(12) United States Patent
Kimura et al.

(10) Patent No.: US 9,535,096 B2
(45) Date of Patent: Jan. 3, 2017

(54) GUIDE PLATE FOR A PROBE CARD AND PROBE CARD PROVIDED WITH SAME

(71) Applicant: Japan Electronic Materials Corporation, Amagasaki-shi, Hyogo (JP)

(72) Inventors: Teppei Kimura, Amagasaki (JP); Liwen Fan, Amagasaki (JP)

(73) Assignee: Japan Electronic Materials Corporation, Amagasaki-shi, Hyogo (JP)

(*) Notice: Subject to any disclaimer, the term of this patent is extended or adjusted under 35 U.S.C. 154(b) by 39 days.

(21) Appl. No.: 14/417,760

(22) PCT Filed: Jul. 25, 2013

(86) PCT No.: PCT/JP2013/070212
§ 371 (c)(1),
(2) Date: Jan. 27, 2015

(87) PCT Pub. No.: WO2014/021194
PCT Pub. Date: Feb. 6, 2014

(65) Prior Publication Data
US 2015/0301083 A1    Oct. 22, 2015

(30) Foreign Application Priority Data

Aug. 1, 2012  (JP) .................. 2012-170786

(51) Int. Cl.
*G01R 3/00* (2006.01)
*G01R 1/073* (2006.01)
(Continued)

(52) U.S. Cl.
CPC .............. *G01R 1/07371* (2013.01); *C25D 5/02* (2013.01); *C25D 5/48* (2013.01); *G01R 1/18* (2013.01); *G01R 31/2889* (2013.01); *G01R 3/00* (2013.01)

(58) Field of Classification Search
None
See application file for complete search history.

(56) References Cited

U.S. PATENT DOCUMENTS

| 6,556,033 B1* | 4/2003 | Kazama ............. G01R 1/06722 324/755.05 |
| 2002/0027022 A1* | 3/2002 | Moriizumi ............ H01L 21/486 174/267 |

(Continued)

FOREIGN PATENT DOCUMENTS

| JP | 06-56779 U | 8/1994 |
| JP | 10-26635 A | 1/1998 |

(Continued)

OTHER PUBLICATIONS

International Search Report for Application No. PCT/JP99/03713 (see WO00/03250), dated Oct. 19, 1999, with English-language translation.

*Primary Examiner* — Jermele M Hollington
*Assistant Examiner* — Suresh K Rajaputra
(74) *Attorney, Agent, or Firm* — Kilyk & Bowersox, P.L.L.C.

(57) ABSTRACT

It is an object of the invention to provide a guide plate for a probe card with fine through holes at tight pitches and with increased strength. The guide plate 100 for a probe card includes a metal base 110; first insulation layers 120; and metal layers 130. The metal base 110 has a plurality of through holes 111 to receive probes therethrough, and inner walls of the through holes 111. The first insulation layers 120 are of tuboid shape and provided on the respective inner walls of the through holes 111 of the metal base 110. The metal layers 130 are provided on the first insulation layers 120.

4 Claims, 6 Drawing Sheets

(51) Int. Cl.
*G01R 1/18* (2006.01)
*C25D 5/02* (2006.01)
*C25D 5/48* (2006.01)
*G01R 31/28* (2006.01)

(56) References Cited

U.S. PATENT DOCUMENTS

2007/0167022 A1* 7/2007 Tsai ................... G01R 1/07371
　　　　　　　　　　　　　　　　　　　438/712
2009/0301770 A1* 12/2009 Cho ........................ C25D 5/48
　　　　　　　　　　　　　　　　　　　174/257

FOREIGN PATENT DOCUMENTS

| JP | 2003-185877 A | 7/2003 |
| JP | 2003-215163 A | 7/2003 |
| JP | 2006-266697 A | 10/2006 |
| JP | 2008-126375 A | 6/2008 |
| WO | WO00/03250 A1 | 1/2000 |

* cited by examiner

GUIDE PLATE FOR A PROBE CARD AND PROBE CARD PROVIDED WITH SAME

TECHNICAL FIELD

The invention relates to guide plates for probe cards for guiding probes and to probe cards provided with the guide plates.

BACKGROUND ART

A guide plate for a probe card of this type has guide holes for receiving therethrough and guiding probes (see patent literature 1). An insulative resin plate is used in the guide plate for a probe card.

CITATION LIST

Patent Literature

Patent Literature 1: Japanese Patent Publication Laid-open No. H10-026635

SUMMARY OF INVENTION

Technical Problem

Probes have been increasingly finer in recent years, along with higher degrees of integration of semiconductor devices. Guide plates for probe cards also have finer guide holes in accordance with outer shapes of probes. Forming fine guide holes at tight pitches requires reduced thicknesses of the guide plates for probe cards. However, reduced thicknesses of the guide plates for probe cards lead to strength degradation of the guide plates for probe cards.

The invention has been made in view of the above circumstances, and it is an object of the invention to provide a guide plate for a probe card with fine through holes at tight pitches and while suppressing strength degradation of the guide plate. A probe card including the guide plate is also provided.

Solution to Problem

To solve the above problems, a guide plate for a probe card of the invention includes a metal base and first insulation layers. The metal base includes a plurality of through holes and inner walls of the through holes, the through holes being adapted to receive probes therethrough. The first insulation layers are of tuboid shape on the respective inner walls of the through holes of the metal base.

As the guide plate for a probe card of this aspect includes the metal base, the thickness of the guide plate can be reduced while maintaining strength of the guide plate. This makes it easy to form fine through holes at tight pitches in the metal base. The first insulation layers of tuboid shape on the inner walls of the through holes can prevent conduction of the probes with each other via the metal base even when the probes are brought into contact with the inner walls of the through holes.

The guide plate for a probe card may further include metal layers on the respective first insulation layers. In the guide plate for a probe card of this aspect, probes received through the through holes may contact with the metal layers. However, the first insulation layers intervening between the metal layers and the metal base can prevent electrical conduction of the probes to each other via the metal base.

The guide plate for a probe card may further include second insulation layers on a main surface and a back surface of the metal base.

A first probe card of the invention includes the guide plate for a probe card of any of the above aspect, a wiring board, and a plurality of probes. The wiring board is disposed so as to face the guide plate for a probe card. The wiring board includes a plurality of electrodes arranged at positions corresponding to the through holes. The probes are received though the through holes of the guide plate. The probes each include a first end in contact with one of the electrodes, a second end opposite the first end, and an elastically deformable portion between the first end and the second end. The elastically deformable portions are configured to elastically deform due to loads on the second ends so as to allow the probes to contact with the guide plate.

The probe card of this aspect can provide substantially the same advantageous effects as the above-described guide plate for a probe card. Also, when the second ends of the probes of the probe card contact with respective electrodes of a semiconductor wafer or semiconductor device and loads are applied to the second ends, high frequency current flows through the probes and thereby generates Joule heat. Such Joule heat may cause melt fractures and brittle fractures of the probes if being fine in size. However, the above probe card is provided with the guide plate having the metal base. When the probes contact with the guide plate, Joule heat in the probes can be dissipated through the metal base. It is therefore possible to suppress melt fractures and brittle fractures of the probes if being fine in size.

A second probe card of the invention includes the guide plate for a probe card of any of the above aspect, a wiring board, and a plurality of probes. The wiring board is disposed so as to face the guide plate. The wiring board includes a plurality of electrodes arranged at positions corresponding to the through holes. The probes are received though the through holes of the guide plate, are in contact with the guide plate, and are in contact with the electrodes.

The probe card of this aspect can provide substantially the same advantageous effects as the above-described guide plate for a probe card. Also, when the probes of the probe card contact with respective electrodes of a semiconductor wafer or semiconductor device, high frequency current flows through the probes and thereby generates Joule heat. Such Joule heat may cause melt fractures and brittle fractures of the probes if they are fine in size. However, the probes are in contact with the guide plate including the metal base, so that Joule heat in the probes can be dissipated through the metal base. It is therefore possible to suppress melt fractures and brittle fractures of the probes if they are fine in size.

DESCRIPTION OF EMBODIMENTS

First and second embodiments of the invention will be described below.

First Embodiment

Figure 1A:
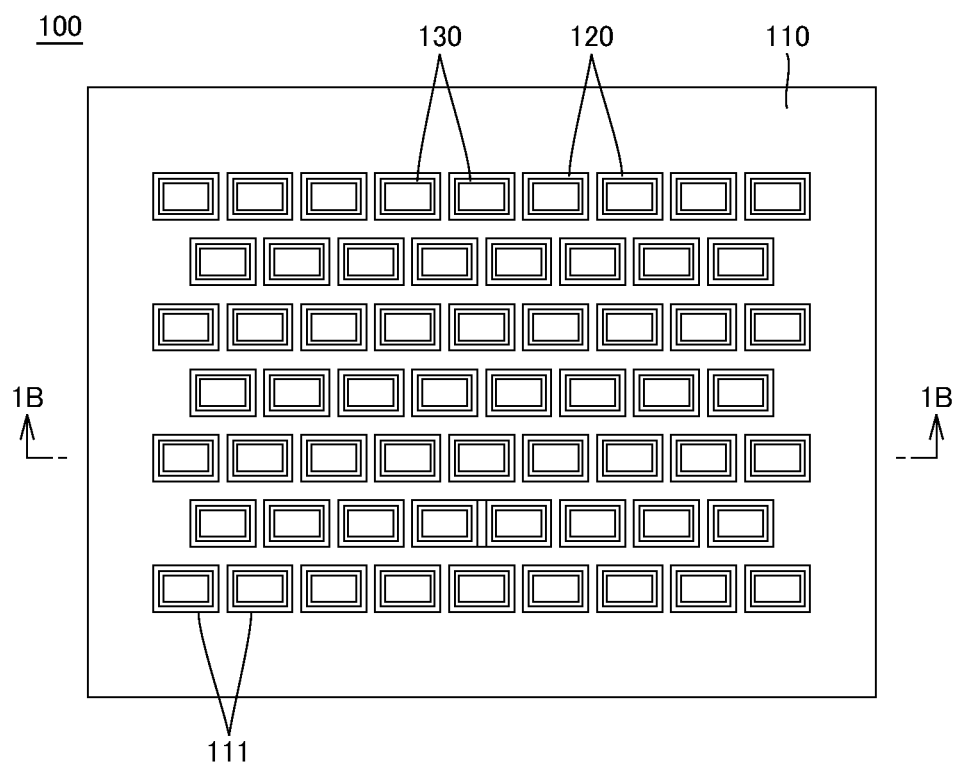
FIG. 1A is a schematic plan view of a guide plate for a probe card according to a first embodiment of the invention.
Figure 1B:
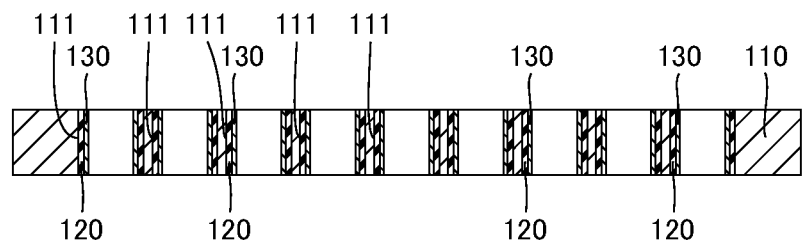
FIG. 1B is a cross-sectional view of the guide plate taken along a line 1B-1B in FIG. 1A.

Firstly, a guide plate for a probe card according to the first embodiment of the invention is described by referring to FIG. 1A and FIG. 1B. The guide plate 100 for a probe card as shown in FIG. 1A and FIG. 1B includes a metal base 110, a plurality of first insulation layers 120, and a plurality of metal layers 130. These constituents of the guide plate 100 will be described in detail below.

The metal base 110 is made of metal having a thermal expansion coefficient (thermal expansion coefficient of 2 ppm/° C. to 10 ppm/° C.) equal or close to that of a semiconductor wafer or semiconductor device. For example, the metal base 110 may be made of aluminum (Al), copper (Cu), nickel (Ni), or an alloy including any of these. The alloy may be alloy of aluminum and copper, alloy of aluminum and nickel, alloy of copper and nickel, alloy of aluminum, copper and nickel, Ni—Fe alloy or the like. The metal base 110 has a plurality of through holes 111 and inner walls 112 of the through holes 111. The through holes 111 pass through the thickness of the metal base 110. The through holes 111 are each a hole in the shape of cylinder or polygonal prism (e.g. quadrangular prism). The through holes 111 have such inner shapes as to allow insertion therethrough of probes 200 of the probe card to be described (see FIG. 3B and FIG. 3C mentioned above). The through holes 111 are arranged at positions corresponding to positions of electrodes of the semiconductor wafer or semiconductor device.

The first insulation layers 120 are formed on the respective inner walls 112 of the through holes 111 of the metal base 110. The first insulation layers 120 are electrically insulating films, e.g. electrically deposited films of organic materials such as a polyimide and an epoxy resin, or sputtered films of $SiO_2$, silicon nitride, or the like. The first insulation layers 120 are in the shape of tube conforming to the inner shape of the through holes 111 (in the shape of tube having a circular or polygonal cross section).

The metal layers 130 are formed on the respective first insulation layers 120 of the through holes 111 of the metal base 110. The metal layers 130 are in the shape of tube conforming to the inner shape of the first insulation layers 120 (in the shape of tube having a circular or polygonal cross section). The metal layers 130 may be made of hard metal, such as Rh- or Ni-based alloy. The metal layers 130 protect the first insulation layers 120.

Figure 2:
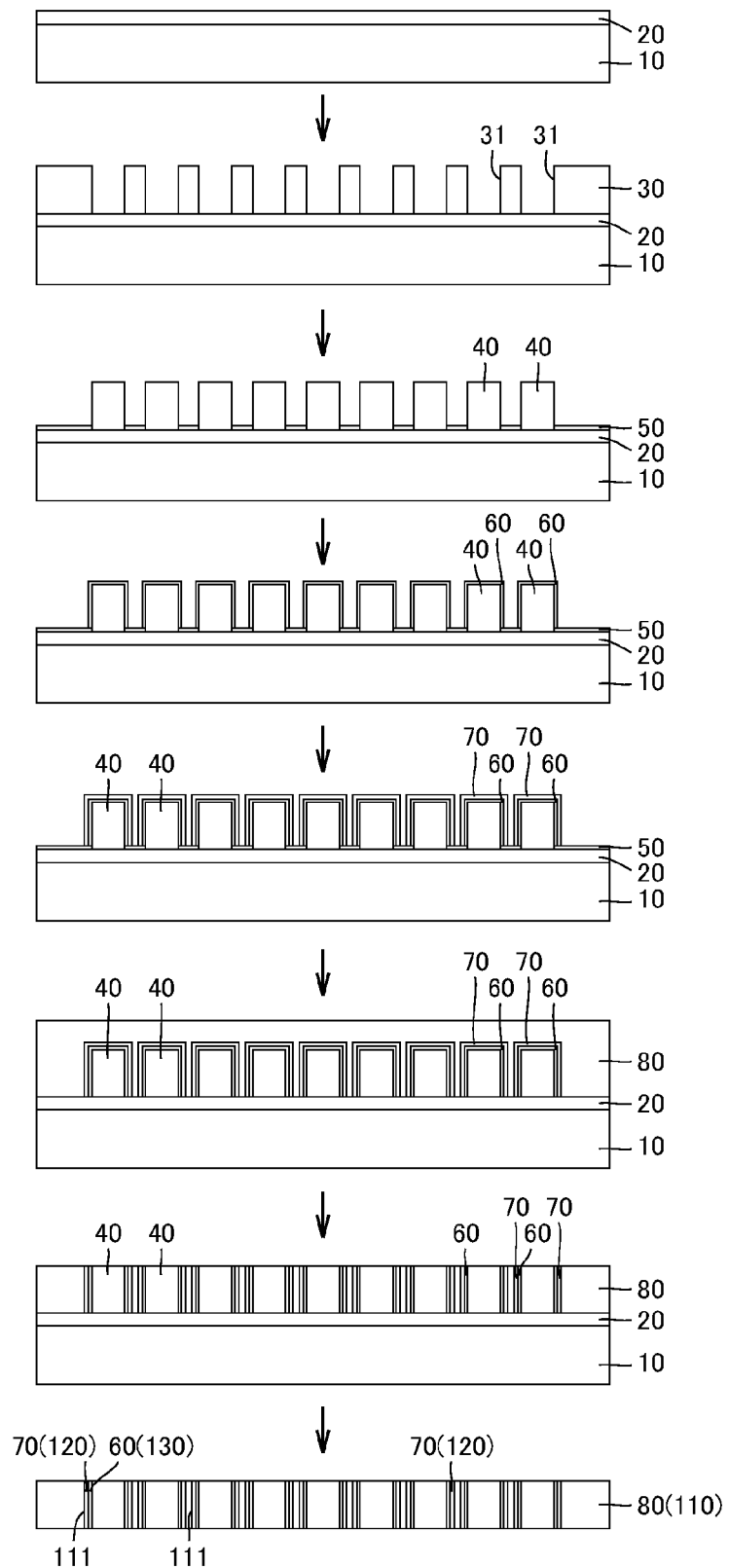
FIG. 2 is a cross-sectional view illustrating steps of manufacturing the guide plate.

A method of manufacturing the guide plate 100 for a probe card having the above-described configuration will be described below by reference to FIG. 2. First, a substrate 10 of ceramic or silicon (Si) is prepared. The substrate 10 is subjected to electroplating to form thereon a sacrificial layer 20 of copper. A resist 30 is applied on top of the sacrificial layer 20. The resist 30 then goes through exposure and developing using a mask to make a plurality of apertures 31.

The apertures 31 of the resist 30 are then subjected to electroplating to fill copper in the apertures 31. Thereafter, the resist 30 is removed, with the copper filled in the apertures 31 left as posts 40 of circular prism shape. Then, a resist 50 is formed on the sacrificial layer 20 by spray coating or by electrodeposition. The resist 50 then goes through exposure and developing to form a pattern to expose the posts 40. Electroplating is given over the outer surfaces of the posts 40 to form a plated layer 60 of hard metal such as Rh- or a Ni-based alloy. A negative voltage is applied to the plated layer 60 to form an insulation film 70 over the plated layer 60 by electrodeposition. The resist 50 is removed.

Thereafter, the sacrificial layer 20 is subjected to electroplating to form a Ni—Fe plated layer 80 over the sacrificial layer 20. This step results in that the posts 40, the plated layer 60 and the insulation film 70 are embedded in the Ni—Fe plated layer 80. Thereafter, grinding is done on the upper face, as shown in FIG. 2, of the Ni—Fe plated layer 80 and on the upper ends, as shown in FIG. 2, of the insulation film 70 and of the plated layer 60. As a result, the upper ends, as shown, of the posts 40 are exposed from the insulation film 70 and the plated layer 60, and the insulation film 70 and the plated layer 60 are formed into cylindrical shapes.

Then, the substrate 10, the sacrificial layer 20, the posts 40, the plated layer 60, the insulation film 70 and the Ni—Fe plated layer 80 are immersed in etchant. The etchant selectively dissolves copper (Cu) so as to etch the sacrificial layer 20 and the posts 40, and the substrate 10 is removed from the Ni—Fe plated layer 80. Consequently, the guide plate 100 for a probe card is obtained. The Ni—Fe plated layer 80 subjected to grinding forms the metal base 110, and holes made by eliminating the posts 40 are the through holes 111. The insulation film 70 consisting of tubes serves as the first insulation layers 120, and the plated layer 60 consisting of tubes serves as the metal layers 130. It should be noted that the Ni—Fe plated layer 80 can be modified in any manner as long as it is a plated layer of metal having a thermal expansion coefficient equal or close to the thermal expansion coefficient of the semiconductor wafer or semiconductor device.

Figure 3A:
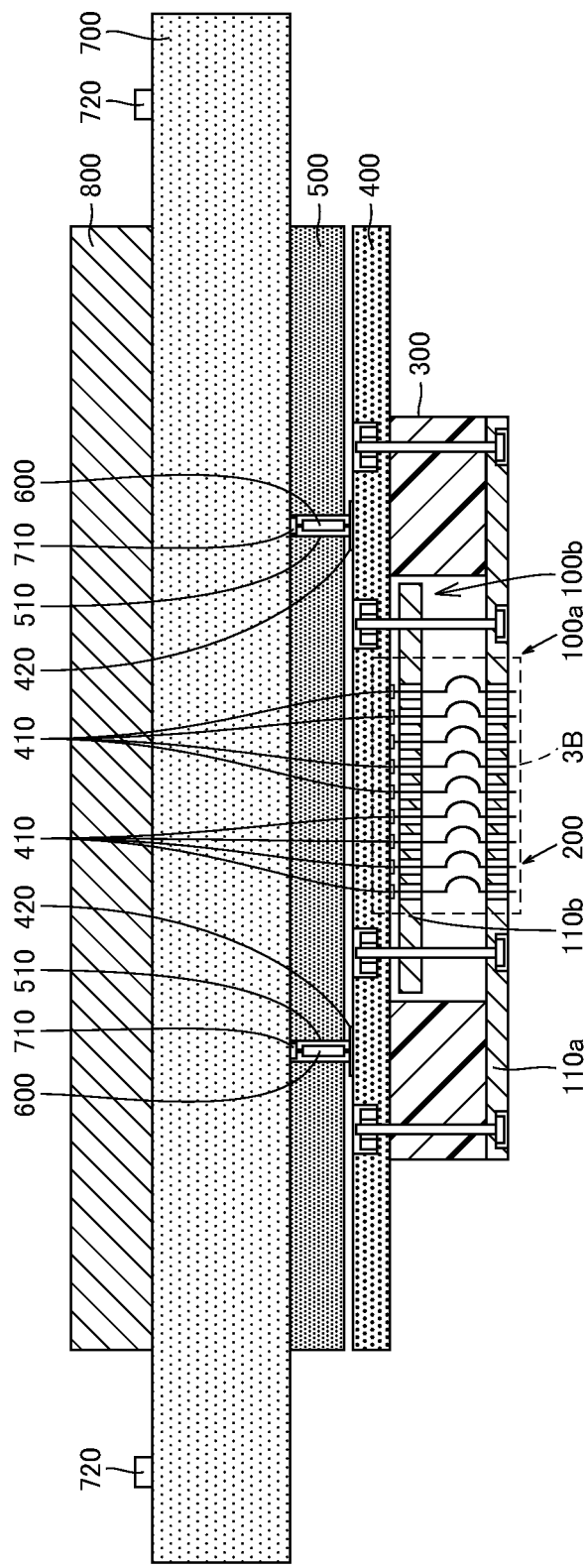
FIG. 3A is a schematic cross-sectional view of the probe card according to the first embodiment of the invention.
Figure 3B:
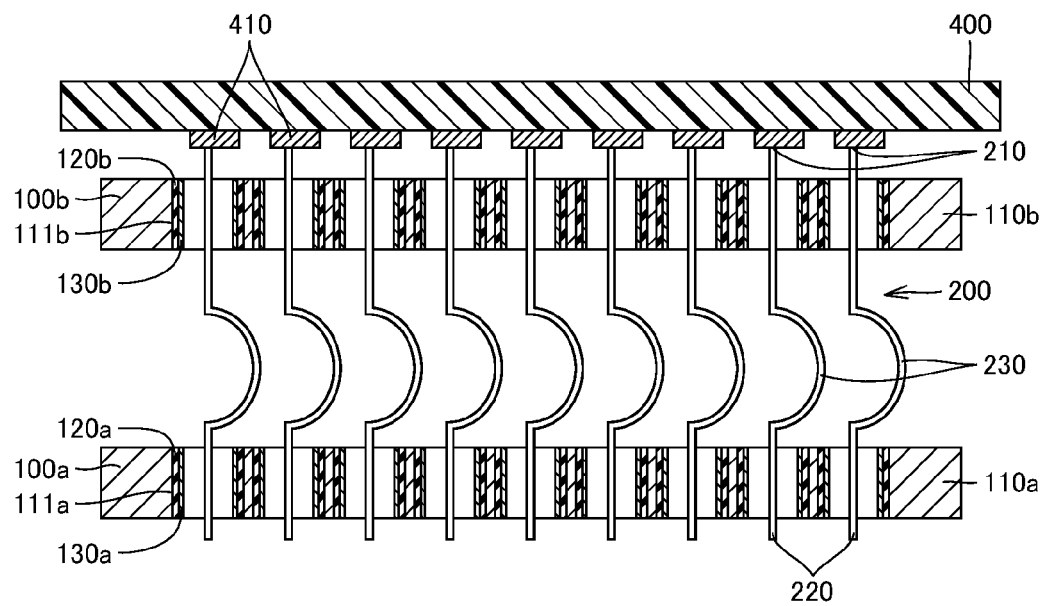
FIG. 3B is an enlarged view of a portion 3B of the probe card shown in FIG. 3A.
Figure 3C:
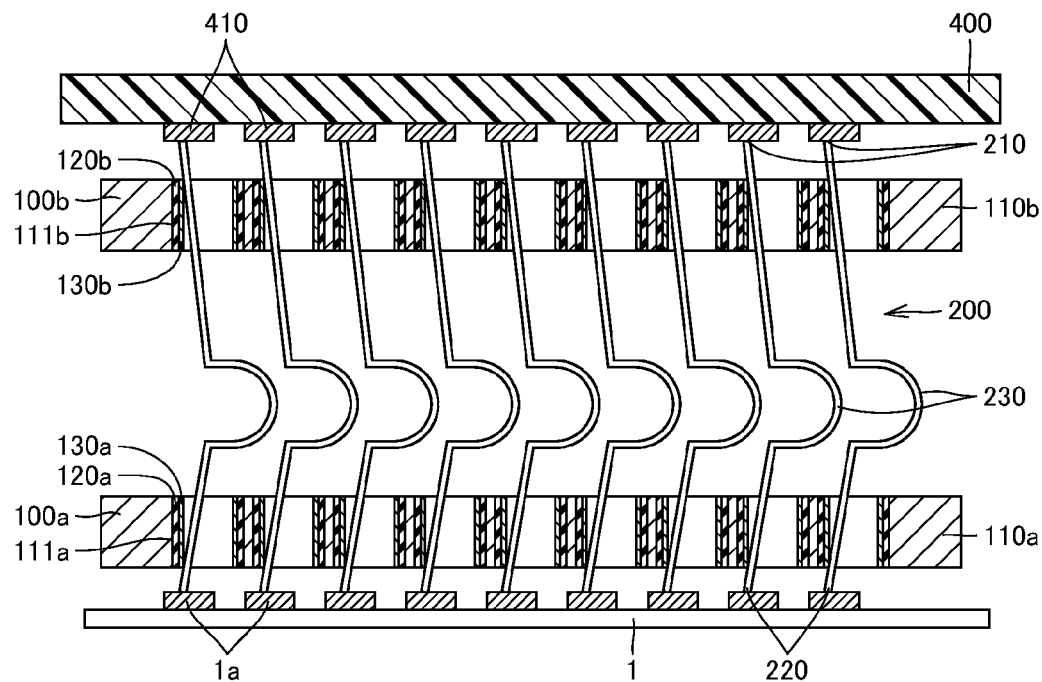
FIG. 3C is an enlarged view of the portion 3B of the probe card at the time of testing the probe card.

The following describes a probe card according to the first embodiment of the invention by reference to FIG. 3A to FIG. 3C. The probe card shown in FIG. 3A includes two guide plates for the probe card as described above, a plurality of probes 200, a spacer 300, a wiring board 400, an intermediate board 500, a plurality of spring probes 600, a main circuit board 700 and a reinforcing plate 800. These constituents of the probe card will be described in detail below. For the convenience of explanation, the two guide plates are identified as follows: guide plate reference numerals with "a" represent the guide plate for the probe card and its subelements at the distal side of the probe 200, while reference numerals with "b" represent the guide plate for the probe card and its subelements at the proximal side of the probe 200.

The main circuit board 700 is a printed circuit board. The main circuit board 700 has a first face and a second face opposite the first face. The first face of the main circuit board 700 is provided with a plurality of electrodes 710. The second face of the main circuit board 700 is provided with a plurality of external electrodes 720 at the outer edges thereof. The electrodes 710 are connected to the external electrode 720 via conductive lines (not shown) on the first face and/or the second face of the main circuit board 700 and/or inside the main circuit board 700.

The reinforcing plate 800 is a plate-like member that is harder than the main circuit board 700 (the reinforcing plate 800 may be a plate of stainless steel or similar material). The reinforcing plate 800 is screwed to the second face of the main circuit board 700. The reinforcing plate 800 serves to suppress warp of the main circuit board 700.

The intermediate board 500 is fixed to the first face of the main circuit board 700 to be disposed between the main circuit board 700 and the wiring board 400. A plurality of through holes 510 extends through the thickness of the intermediate board 500. The through holes 510 are arranged at positions corresponding to the positions of the electrodes 710 of the main circuit board 700.

The wiring board 400 is a space transformer (ST) board. The wiring board 400 is fixed to the main circuit board 700 and the reinforcing plate 800 with fixing screws not shown so as to extend below the intermediate board 500, as shown in FIG. 3, and in parallel to the main circuit board 700. The wiring board 400 has a first face and a second face that is opposite to the first face. The first face of the wiring board 400 is provided with a plurality of electrodes 410 at positions corresponding to the through holes 111a, 111b of the guide plates 100a, 100b for the probe card. The second face of the wiring board 400 is provided with a plurality of electrodes 420 arranged at intervals. The electrodes 420 are located on the respective plumb lines through the electrodes 710 of the main circuit board 700. The electrodes 410 are connected to the electrodes 420 via a plurality of conductive lines (not shown) on the first face and/or the second face of the wiring board 400 and/or inside the wiring board 400.

The spring probes 600 are received in the through hole 510 of the intermediate board 500 to be interposed between the electrode 710 of the main circuit board 700 and the electrode 420 of the wiring board 400. The spring probes 600 thus electrically connect between the electrodes 710 and the electrodes 420.

The guide plates 100a, 100b for the probe card have the same configuration as that of the guide plate 100 for a probe card, except that the guide plate 100b for the probe card has smaller outer dimensions than the guide plate 100a for the probe card. As shown in FIG. 3A, the guide plate 100a for the probe card is fixed to the wiring board 400, spaced thereto and parallel thereto, with bolts and nuts. Spacers 300 are interposed between the opposite ends of the guide plate 100a for the probe card and the wiring board 400. The guide plate 100b for the probe card is fixed to the wiring board 400, parallel thereto and spaced thereto, with bolts and nuts so as to be disposed between the wiring board 400 and the guide plate 100a for the probe card. The through holes 111a of the guide plate 100a for the probe card are arranged in spaced relation in the plumb line direction (the vertical direction as shown in FIG. 3A to FIG. 3C) relative to the respective through holes 111b of the guide plate 100b for the probe card.

As shown in FIG. 3B, the probes 200 each include a first end 210, a second end 220, and an elastically deformable portion 230. Each first end 210, a lengthwise end of each probe 200, is received through an associated through hole 111b of the guide plate 100b for the probe card and contactable with the metal layer 130b of the through hole 111b. The first end 210 is in contact with and soldered to an associated electrode 410 of the wiring board 400. In other words, the first ends 210 of the probes 200 are fixed to the electrodes 410 by soldering. Each second end 220, the other lengthwise end of each probe 200 (i.e. the end opposite to the first end 210), is received through an associated through hole 111a of the guide plate 100a for the probe card and contactable with the metal layer 130a of the through hole 111a. The second end 220 is a portion that is contactable with an electrode of a semiconductor wafer or of a semiconductor device. Each elastically deformable portion 230 is provided between the first end 210 and the second end 220 and bent generally in a C-shape.

The above-described probe card is to be mounted on a prober of a tester (not shown) and serves to measure electrical characteristics of a measuring object 1 (see FIG. 3C), which is a semiconductor wafer or semiconductor device as described below. Specifically, the prober makes the probe card and the measuring object 1 face each other and then come close to each other. Then, the second ends 220 of the probes 200 of the probe card are respectively brought into contact with electrodes 1a of the measuring object 1, which respectively press the second ends 220 of the probes 200 (that is, loads are imposed on the second ends 220). Then, the elastically deformable portions 230 of the probes 200 are elastically deformed to buckle, so that the probes 200 generally buckle. The first ends 210 of the buckled probes 200 tilt to respectively contact with the upper ends (as shown in FIG. 3C) of the metal layer 130b of the guide plate 100b for the probe card, while the second ends 220 of the probes 200 tilt to respectively contact with the lower ends (as shown in FIG. 3C) of the metal layers 130a of the guide plate 100a for the probe card. This state allows the tester to measure electrical characteristics of the measuring object 1.

In the probe card as described above, as the guide plates 100a, 100b for the probe card include the metal bases 110a, 110b, respectively, as their base material, the thickness of the guide plates 100a, 100b can be reduced while maintaining strengths of the guide plates 100a, 100b. Accordingly, fine through holes 111a, 111b can be easily formed in the metal bases 110a, 110b, respectively, at tight pitches.

Further, the first insulation layers 120b, 120a and the metal layers 130b, 130a are laminated in this order on the inner walls 112a, 112b of the through holes 111b, 111a of the metal bases 110b, 110a. In other words, each first insulation layer 120b exists between the inner wall 112b of each through hole 111b and each metal layer 130b, and each first insulation layer 120a exists between the inner wall 112a of each through hole 111a and each metal layer 130a. This makes it possible to prevent conduction of the probes 200 with each other via the metal bases 110b, 110a even when the first and second ends 210, 220 of the probe 200 are brought into contact with the metal layers 130b, 130a. Further, when the second ends 220 of the probes 200 respectively contact with the electrodes 1a of the measuring object 1, high-frequency current flows through the probes 200 and thereby generates Joule heat in the probes 200. It should be noted that, during a period when the Joule heat is generated, the first and second ends 210, 220 of the respective probes 200 are in contact with the metal layers 130b, 130a of the through holes 111b, 111a of the metal bases 110b, 110a. Hence, the Joule heat in the probes 200 can be dissipated through the metal bases 110b, 110a. It is therefore possible to suppress melt fractures and brittle fractures of the fine probes 200 due to such Joule heat. The dissipated Joule heat also contributes to an increased value of the current flowing through the probes 200.

Further, metal bases 110a, 110b are made of metal having a thermal expansion coefficient equal or close to that of a semiconductor wafer or semiconductor device. Accordingly, even when the probe card is used for measuring electrical characteristics of a semiconductor wafer or semiconductor device under a hot environment, the heat causes the guide plates 100a, 100b for the probe card to expand in a same or similar manner to the semiconductor wafer or semiconductor device. If the guide plates 100a, 100b for the probe card thermally expanded in a very different manner from the semiconductor wafer or semiconductor device, the second ends 220 of the probes 200 guided by the through holes 111a of the guide plate 100a for the probe card would be displaced relative to the electrodes of the semiconductor wafer or semiconductor device. Such displacement would cause contact failures of the probes 200 to the semiconductor wafer or semiconductor device. However, such possibility can be reduced in the present probe card. Further, denoising can be achieved by grounding the metal bases 110a, 110b.

Second Embodiment

Figure 4A:
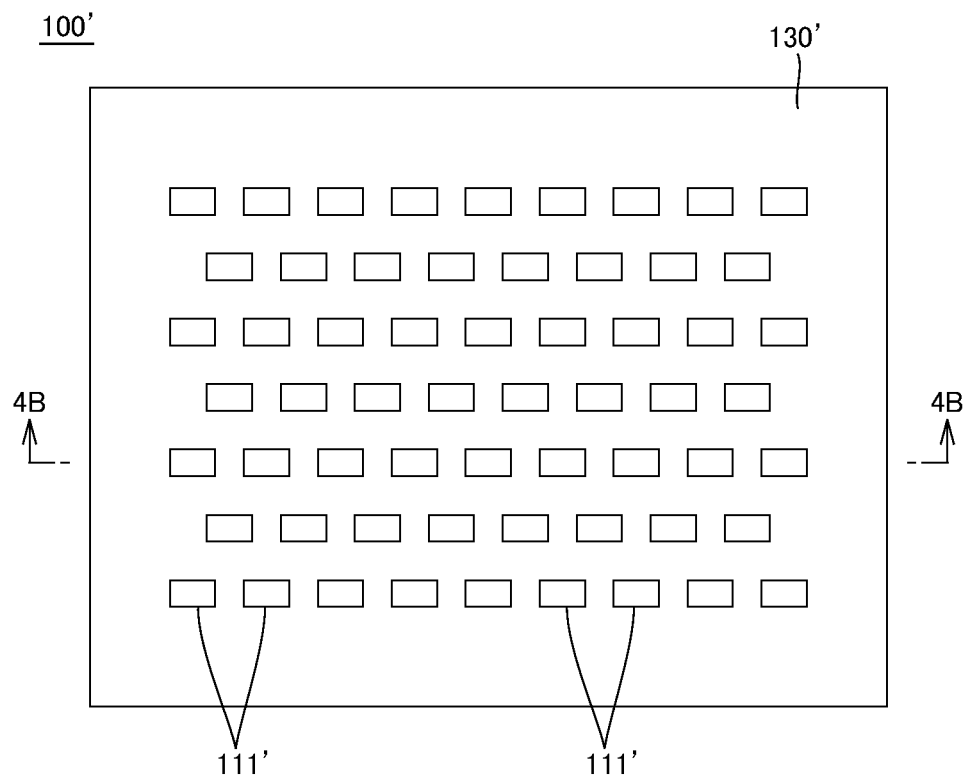
FIG. 4A is a schematic plan view of a guide plate for a probe card according to a second embodiment of the invention.
Figure 4B:
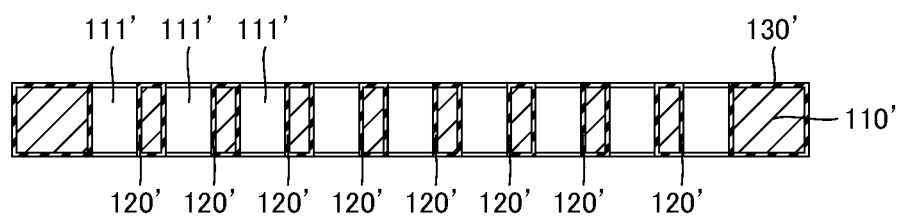
FIG. 4B is a cross-sectional view of the guide plate taken along a line 4B-4B in FIG. 4A.

Next, a guide plate for a probe card according to the second embodiment of the invention will be described by reference to FIG. 4A and FIG. 4B. The guide plate 100' for a probe card shown in FIG. 4A and FIG. 4B includes a metal base 110', a plurality of first insulation layers 120' and a plurality of second insulation layers 130'. These constituents of the guide plate 100' will be described in detail below.

The metal base 110' is made of metal having a thermal expansion coefficient (thermal expansion coefficient of 4 ppm/° C. to 10 ppm/° C.) equal or close to that of a semiconductor wafer (not shown) or a semiconductor device (not shown). For example, the metal base 110' may be made of a Ni—Fe alloy. The metal base 110' have a plurality of through holes 111' and inner walls 112' of the through holes 111'. The through holes 111' pass through the thickness of the metal base 110'. The through holes 111' are each a hole in the shape of cylinder or polygonal prism (e.g. quadrangular prism). The through holes 111' have such inner shapes as to allow insertion therethrough of probes 200 of the probe card to be described (see FIG. 3B and FIG. 3C mentioned above). The through holes 111' are arranged at positions corresponding to positions of electrodes of the semiconductor wafer or semiconductor device.

Insulative oxide film layers are formed by thermally-oxidization on the outer surfaces, namely the upper surface (main surface in the claims), the lower surface (back surface in the claims) and the outer peripheral surface, of the metal base 110' and the inner walls 112' of the through holes 111'. The insulative oxide film layers (thickness: 0.5 µm to 2 µm) formed on the outer surfaces of the metal base 110' will be referred to as second insulation layers 130', and the insulative oxide film layers formed on the inner walls 112' of the through holes 111' will be referred to as first insulation layers 120'. The first insulation layers 120' and the second insulation layers 130' are continuous with each other. The first insulation layers 120' are in the shape of tube conforming to the inner shape of the through holes 111' (in the shape of tube having a circular or polygonal cross section). The first and second insulation layers 120', 130' are electrically insulative.

Figure 5:
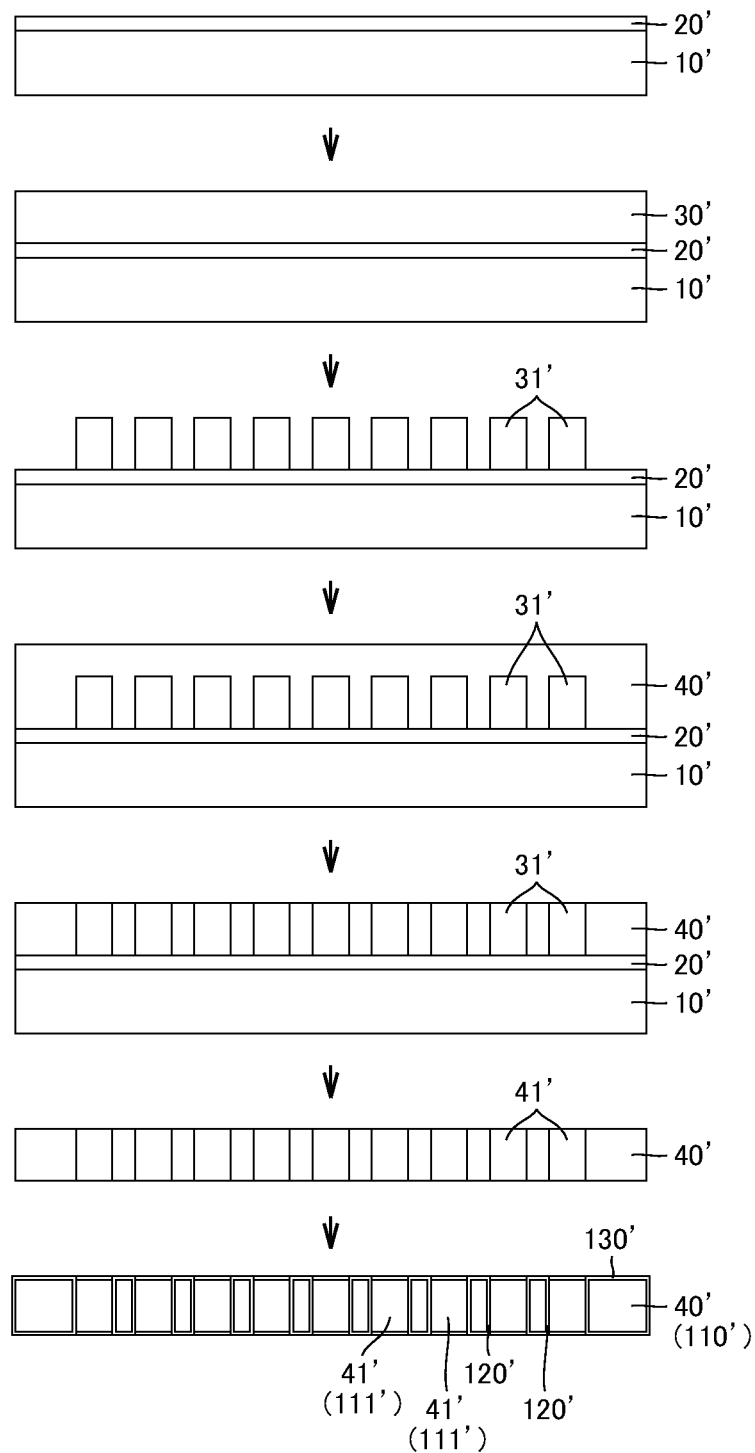
FIG. 5 is a cross-sectional view illustrating steps of manufacturing the guide plate.

A method of manufacturing the guide plate 100' for a probe card having the above-described constitution will be described below by reference to FIG. 5. First, a substrate 10' of ceramic or silicon (Si) is prepared. The substrate 10' is subjected to electroplating to form thereon a copper sacrificial layer 20'. A resist 30' is applied on top of the sacrificial layer 20'. The resist 30' then goes through exposure and developing using a mask to form a plurality of resist posts 31' on the sacrificial layer 20' (i.e. portions of the resist 30' other than the resist posts 31' are removed).

Then electroplating is performed on the sacrificial layer 20' to form thereon a Ni—Fe plated layer 40'. This step results in that the resist posts 31' are embedded in the Ni—Fe plated layer 40'. Thereafter, grinding is done on the upper surface, as shown, of the Ni—Fe plated layer 40' so as to expose the upper ends, as shown in FIG. 5, of the resist posts 31' from the Ni—Fe plated layer 40'. The resist posts 31' are then removed to make the through holes 41' in the Ni—Fe plated layer 40'.

The substrate 10', the sacrificial layer 20' and the Ni—Fe plated layer 40' are immersed in an etchant. The etchant selectively dissolves copper (Cu) so as to etch the sacrificial layer 20', and the substrate 10' is removed from the Ni—Fe plated layer 40'. Alternatively, in place of etching the sacrificial layer 20', it is also possible to physically remove the substrate 10' from the sacrificial layer 20' and physically remove the sacrificial layer 20' from the Ni—Fe plated layer 40'. Thereafter, the Ni—Fe plated layer 40' is heated in an inert gas containing an oxygen gas at a temperature of 400° C. to 800° C. for thermally oxidizing the outer surfaces, namely the upper surface (main surface), the lower surface (back surface) and the outer peripheral surface, of the Ni—Fe plated layer 40' and the inner walls of the through holes 41'. This is how to obtain the guide plate 100' for a probe card. The Ni—Fe plated layer 40' forms the metal base 110', and the through holes 41' form the through holes 111'. The insulative oxide film layers formed on the outer surfaces of the Ni—Fe plated layer 40' by thermal oxidation form the second insulation layers 130', and the insulative oxide film layers formed on the inner walls of the through holes 41' form the first insulation layers 120'. The Ni—Fe plated layer 40' can be modified to any metal plated layer having a thermal expansion coefficient equal or close to that of the semiconductor wafer or semiconductor device.

The following describes a probe card according to the second embodiment of the invention is described by reference to FIG. 3A to FIG. 3C for convenience of explanation. This probe card has the same configuration as the probe card of the first embodiment, except that the present probe card has two guide plates 100' for the probe card, not the guide plates 100a, 100b for a probe card. The difference will be described in detail below, but the overlapping features will not be described.

Two guide plates 100' for a probe card differ from each other in that that one of the guide plates 100' for the probe card has smaller outer dimensions than the other. The one of the guide plates 100' for the probe card is used in place of the guide plate 100b for the probe card, and the other guide plate 100' for the probe card is used in place of the guide plate 100a for the probe card. Specifically, the other guide plate 100' for the probe card is fixed to the wiring board 400, spaced thereto and parallel thereto, with bolts and nuts. Spacers 300 are interposed between the opposite ends of the other guide plate 100' for the probe card and the wiring board 400. The one of the guide plates 100' for the probe card is fixed to the wiring board 400, parallel thereto and spaced thereto, with bolts and nuts so as to be disposed between the wiring board 400 and the other guide plate 100' for the probe card. The through holes 111' of the one of the guide plates 100' for the probe card are arranged are arranged in spaced relation in the plumb line direction (the vertical direction as shown in FIG. 3A to FIG. 3C) relative to the respective through holes 111' of the other guide plate 100'.

The first end 210 of each probe 200 is received through an associated through hole 111' of the one of the guide plates 100' for the probe card and contactable with the first insulation layer 120' of the through hole 111'. The second end 220 of each probe 200 is received through an associated through hole 111' of the other guide plate 100' for the probe card and contactable with the first insulation layer 120' of the through hole 111'.

The above-described probe card is to be mounted on a prober of a tester (not shown) and serves to measure electrical characteristics of a measuring object 1 (see FIG. 3C for convenience of explanation), which is a semiconductor wafer or semiconductor device. Specifically, the prober makes the probe card and the measuring object 1 face each other and then come close to each other. Then, the second ends 220 of the probes 200 of the probe card are respectively brought into contact with electrodes 1a of the measuring object 1, which respectively press the second ends 220 of the probes 200 (that is, loads are imposed on the second ends 220). Then, the elastically deformable portions 230 of the probes 200 are elastically deformed to buckle, so that the probes 200 generally buckle. The first ends 210 and the second ends 220 of the buckled probes 200 are brought into contact with the upper and lower ends, respectively (as shown in FIG. 3C, referred to for convenience of explanation) of the first insulation layers 120' of one and the other, respectively, of the guide plates 100' for the probe card. This state allows the tester to measure electrical characteristics of the measuring object 1.

In the probe card as described above, as the guide plates 100' for the probe cards include the metal bases 110' as their base material, the thickness of the guide plates 100' can be reduced while maintaining strengths of the guide plates 100'. This makes it easy to form fine through holes 111' at tight pitches in the metal bases 110'.

Further, the first insulation layers 120' are formed on the inner walls 112' of the through holes 111' of the metal bases 110'. This makes it possible to prevent electrical conduction of the probes 200 to each other via the metal bases 110' even when the first and second ends 210, 220 of the probes 200 contact with the first insulation layers 120'. Further, when the second ends 220 of the probes 200 respectively contact with the electrodes 1a of the measuring object 1, high-frequency current flows through the probes 200 and thereby generates Joule heat in the respective probes 200. It should be noted that, during a period when the Joule heat is generated, the first and second ends 210, 220 of the respective probes 200 are in contact with the first insulation layers 120' of the through holes 111' of the metal bases 110'. Hence, the Joule heat in the probes 200 can be dissipated through the metal bases 110'. It is therefore possible to suppress melt fractures and brittle fractures of the probes 200, if being fine in size, due to such Joule heat. The dissipated Joule heat also contributes to an increased value of the current flowing through the probes 200.

Further, the metal bases 110' are made of metal having a thermal expansion coefficient equal or close to that of a semiconductor wafer or semiconductor device. Accordingly, in the case where the probe card is used for measuring electrical characteristics of such a semiconductor wafer or semiconductor device under a hot environment, the guide plates 100' for the probe card expands in a same or similar manner to the semiconductor wafer or semiconductor device. If the guide plates 100' for the probe card thermally expanded in a very different manner from the semiconductor wafer or semiconductor device, the second ends 220 of the probes 200 guided by the through holes 111' of the guide plate 100' for the probe card would be displaced relative to the electrodes of the semiconductor wafer or semiconductor device. Such displacement would cause the probes 200 to fail to contact with the semiconductor wafer or semiconductor device. However, such possibility can be reduced in the present probe card. Further, denoising can be achieved by grounding the metal base 110'.

The above-described guide plates for probe cards and the above-described probe cards are not limited to the above-described embodiments but can be modified in any manner within the scope of claims. The modifications will be described in detail hereinafter.

In the above first and second embodiments, the metal base of a guide plate for a probe card is made of metal having a thermal expansion coefficient equal or close to that of a semiconductor wafer or semiconductor device. However, metal constituting the metal base is not limited to metals described in the above first and second embodiments but may be other metals. Further, any modifications may be made to the inner walls of the through holes of the metal base as long as they are provided thereon at least with the tuboid first insulation layers. For example, one or a plurality of other layers (metal layers, insulation layers, etc.) can be provided on each first insulation layer. The first insulation layers 120 of the first embodiment may be modified to insulative oxide film layers formed by thermally oxidizing the inner walls of the through holes 111 of the metal base 110. The first insulation layers 120' of the second embodiment may be modified to organic electrodeposition films of polyimide, an epoxy resin or the like, or to sputtered films of sputtered films of $SiO_2$, silicon nitride, or the like, laminated on the inner walls of the through holes 111' of the metal base 110'.

In the above second embodiment, the second insulation layers 130' as insulative oxide film layers are formed on the upper surface, the lower surface, and the outer peripheral surface of the metal base 110'. However, they may be modified to any configuration in which at least one of the upper surface (main surface), the lower surface (back surface), and the outer peripheral surface of the metal base 110' is provided with a second insulation layer. For example, the second insulation layers as insulative oxide film layers may be provided only on the upper surface and the lower surface, formed by thermally oxidizing the metal base with its outer peripheral surface masked. It is also possible to laminate the second insulation layer(s) on at least one of the upper surface, the lower surface and the outer peripheral surface of the metal base 110'. Still further, it is possible to provide the second insulation layers as insulative oxide film layers only on the inner walls of the through holes of the metal base by masking the upper surface, the lower surface, and the outer peripheral surface of the metal base 110'.

In the above first embodiment, the metal layers 130 are in the shape of tube conforming to the inner shape of the first insulation layers 120. However, the metal layers can be omitted. Alternatively, the metal layers may be modified to any layer on the first insulation layers. For example, the metal layers can be provided only on portions of the first insulation layers (on portions contactable with the probes). The metal layer may be of metals other than hard metal such as Rh- or Ni-based alloy.

In the above first and second embodiments, the probes 200 each include the first end 210, the second end 220, and the elastically deformable portion 230. However, the probe can be modified in any manner as long as they may be received through through-holes formed in a guide plate for a probe card according to the first or second embodiment or one of the modifications as described above. For example, the probes may be needles of rectilinear or cantilever shape. Also in this case, at least one of the first and second lengthwise ends of each probe can be inserted through a through hole formed in a guide plate for a probe card according to the first or second embodiment or one of the modifications as described above.

In the first embodiment, the probes 200 are contactable with the first insulation layers on the inner walls of the through holes of the guide plate for the probe card, while in the second embodiment, the probes 200 are contactable with the metal layers on the first insulation layers of the guide plate for a probe card. However, the probes may not be contactable with the first insulation layers on the inner walls of the through holes of the guide plate for a probe card or with the metal layers on the first insulation layers. Alternatively, the probes may be always in contact with the first insulation layers on the inner walls of the through holes of a guide plate for a probe card or with the metal layers on the first insulation layers (that is, the probes may be always in contact with a guide plate).

The elastically deformable portions can be omitted. In the first and second embodiments, the elastically deformable portions 230 of the probes 200 are generally of C-shape. However, the elastically deformable portions may be any shape that allow elastic deformation when the second ends of the probes are under load so as to contact with the first insulation layers or the metal layers of the through holes of a guide plate for a probe card according to the first or second embodiment or one of the modifications as described above. For example, the elastically deformable portions may be generally of L-shape, or of a shape having a portion tilted with respect to the lengthwise direction of the first and the second ends.

The probe card can be provided without the intermediate board 500, the spring probe 600, the main circuit board 700 and/or the reinforcing plate 800. Further, the wiring board may or may not be connected to another board (including the main circuit board). The wiring board itself can be used as the main circuit board. The wiring board may be electrically connected to another circuit board via the spring probes 600 or via any well-known connection means such as common probes and cables. Any of the modification as described in this paragraph may be made to a probe card with probes that are always in contact with the guide plate.

It should be appreciated that the materials, shapes, dimensions, numbers, arrangements, and other configurations of the constituents of the guide plates for a probe card and the probe cards of the above embodiments are described by way of example only and may be modified in any manner if they can perform similar functions.

REFERENCE SIGNS LIST 100, 100a, 100b: guide plate for a probe card
  110, 110a, 110b: metal base
  111, 111a, 111b: through hole
  112, 112a, 112b: inner wall of through hole
  120, 120a, 120b: first insulation layer
  130, 130a, 130b: metal layer
100': guide plate for a probe card
  110': metal base
  111': through hole
  112': inner wall of through hole
  120': first insulation layer
  130': second insulation layer
200: probe
  210: first end
  220: second end
  230: elastically deformable portion
300: spacer
400: wiring board
500: intermediate board
600: spring probe
700: main circuit board
800: reinforcing plate

The invention claimed is:

1. A method of manufacturing a guide plate for a probe card, the method comprising:
forming first plated layers on respective outer surfaces of a plurality of posts;
forming insulation films on the respective first plated layers;
forming a second plated layer such that the posts, the first plated layers, and the insulation films are embedded in the second plated layer; and
eliminating the posts such that the second plated layer has through holes at portions where the posts have been eliminated.

2. The method according to claim 1, wherein
the posts are provided on a sacrificial layer of copper,
the forming of the first plated layers includes giving electroplating over the posts to form the first plated layers on the respective outer surfaces of the posts,
the forming of the insulation films includes applying a negative voltage to the first plated layers to form the insulation films over the first plated layers by electrodeposition,
the forming of the second plated layer includes giving electroplating over the sacrificial layer to form thereon the second plated layer with the posts, the first plated layers, and the insulation films embedded in the second plated layer,
the method further includes removing the sacrificial layer together with the removal of the posts.

3. A guide plate for a probe card manufactured by the method according to claim 1, the guide plate comprising:
a metal base consisting of the second plated layer including the through holes, the through holes being adapted to receive probes therethrough;
the insulation films on respective inner walls of the through holes of the metal base; and
the first plated layers on the respective insulation films.

4. A guide plate for a probe card manufactured by the method according to claim 2, the guide plate comprising:
a metal base consisting of the second plated layer including the through holes, the through holes being adapted to receive probes therethrough;
the insulation films on respective inner walls of the through holes of the metal base; and
the first plated layers on the respective insulation films.

* * * * *